United States Patent [19]

Kurtzman et al.

[11] Patent Number: 4,714,899

[45] Date of Patent: Dec. 22, 1987

[54] FREQUENCY SYNTHESIZER

[75] Inventors: Gary Kurtzman, No. Richland Hills; Joseph P. Heck, Fort Worth; Kenneth A. Hansen, Bedford, all of Tex.; Ralph Enderby, Sunrise, Fla.; Bronis Vidugiris, Arlington Heights, Ill.

[73] Assignee: Motorola, Inc., Schaumburg, Ill.

[21] Appl. No.: 913,426

[22] Filed: Sep. 30, 1986

[51] Int. Cl.[4] .......................... H03L 7/06; H03L 7/10
[52] U.S. Cl. ..................................... 331/1 A; 331/16; 331/17; 331/25; 455/260
[58] Field of Search ................. 331/1 A, 2, 10, 14, 331/15, 16, 17, 18, 23, 25, 30, 32; 375/81, 120; 455/260

[56] References Cited

U.S. PATENT DOCUMENTS

| | | | |
|---|---|---|---|
| 4,316,151 | 2/1982 | Ooms | 331/1 A |
| 4,325,031 | 4/1982 | Ooms et al. | 331/1 A |
| 4,330,758 | 5/1982 | Swisher et al. | 331/16 X |
| 4,449,250 | 5/1984 | Kurby | 331/17 X |
| 4,490,688 | 12/1984 | Borras et al. | 331/17 X |
| 4,510,465 | 4/1985 | Rice et al. | 332/16 T |
| 4,516,083 | 5/1985 | Turney | 331/1 A |
| 4,559,505 | 12/1985 | Suarez et al. | 331/1 A |
| 4,574,243 | 3/1986 | Levine | 328/155 |

OTHER PUBLICATIONS

Motorola Syntor X FM Two-Way Radio—Instruction Manual 68P81044E40-B.
Electronic Components and Applications, vol. 3, No. 1 (Nov. 1980, entitled Frequency Synthesiser Using LSI Devices, pp. 47-61—P. R. Brennand and B. Murray.
IEEE Journal of Solid-State Circuits, vol. SC-15, No. 6, Dec. 1980, entitled An Eight-Channel 8 Bit Microprocessor Compatible NMOS D/A Converter with Programmable Scaling—Luc A. Bienstman and Hugo J. DeMan, pp. 1051-1059.
IEEE Journal of Solid-State Circuits, vol. SC-14, No. 4, Aug. 1979, entitled Low-Frequency Noise Considerations for MOS Amplifiers Design, pp. 773-778, Jean-Claude Bertails.
IEEE Journal of Solid-State Circuits, vol. SC—17, No. 6, Dec. 1982, entitled MOS Operational Amplifier Design—A Tutorial Overview, pp. 969-982, Paul R. Gray, Fellow, IEEE, and Robert G. Meyer, Fellow, IEEE.

Primary Examiner—Eugene R. LaRoche
Assistant Examiner—David Mis
Attorney, Agent, or Firm—Thomas G. Berry

[57] ABSTRACT

A programmable frequency synthesizer is disclosed having most components implemented on a single large scale integration (LSI) chip, which facilitates rapid frequency acquisition. Provision is made by the present invention to configure the frequency synthesizer for use in either a receiver or a transmitter. In the transmitter mode, modulation cancelling allows modulation down to approximate DC. A serial programming protocol is provided to program the frequency synthesizer.

16 Claims, 19 Drawing Figures

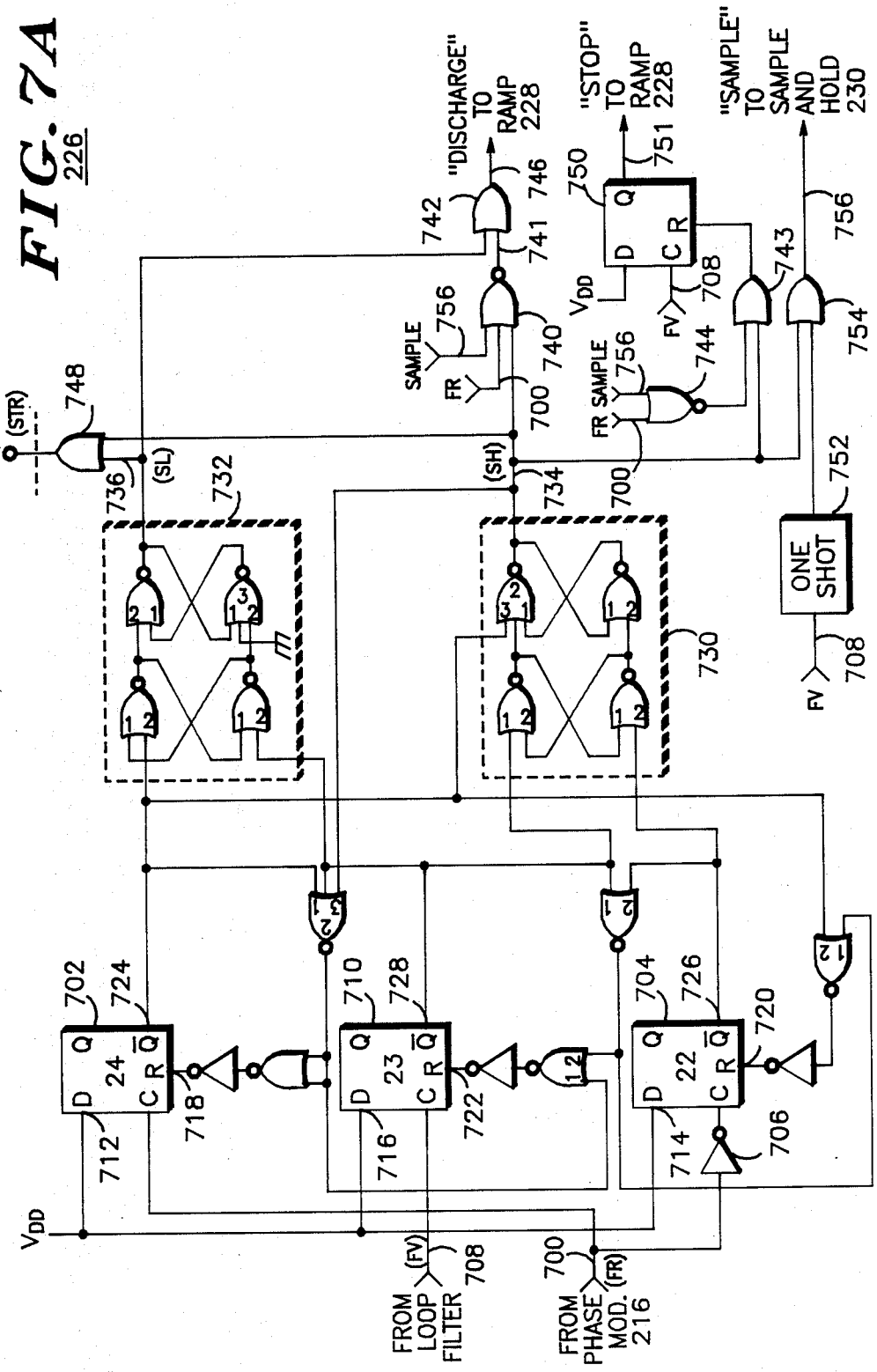

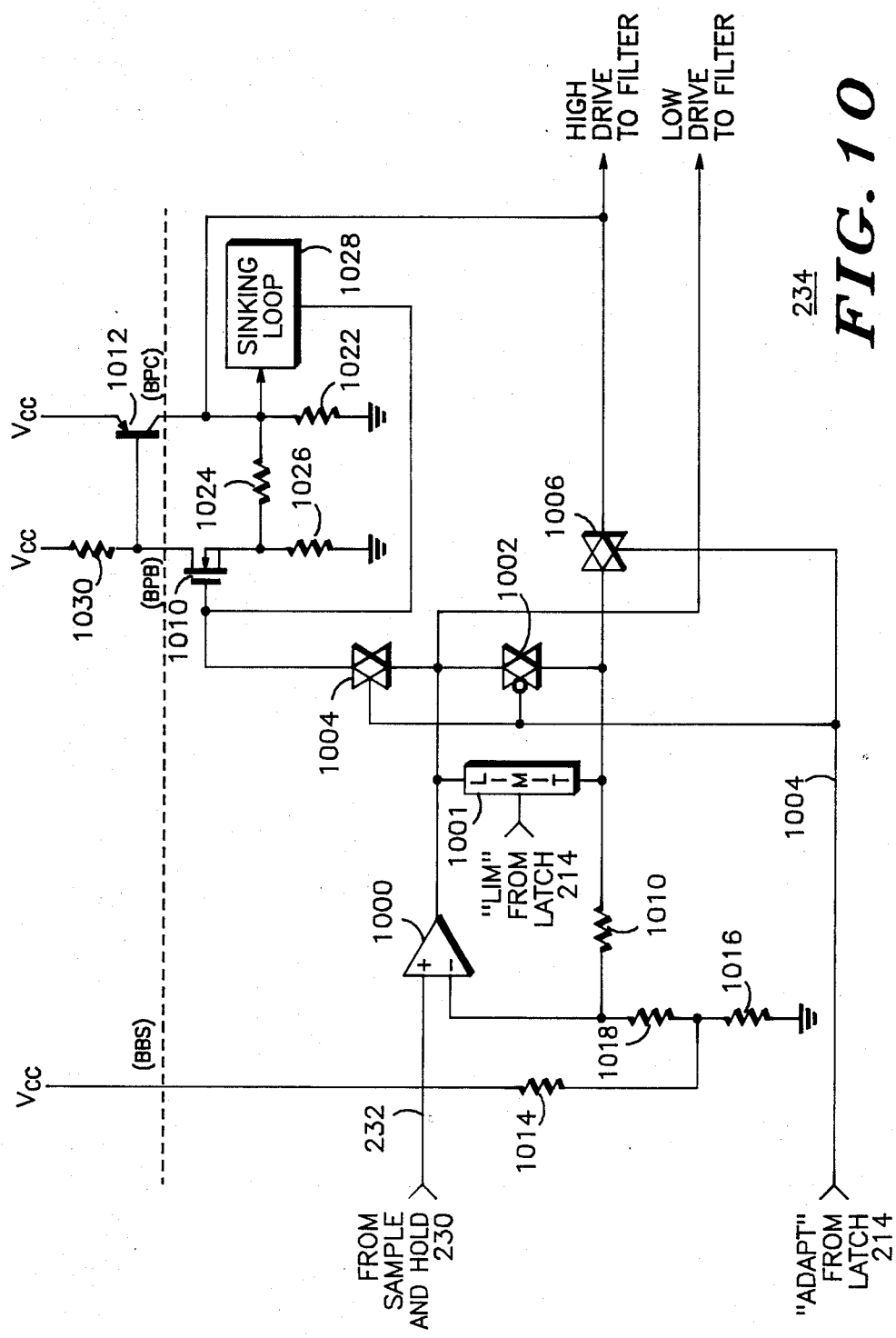

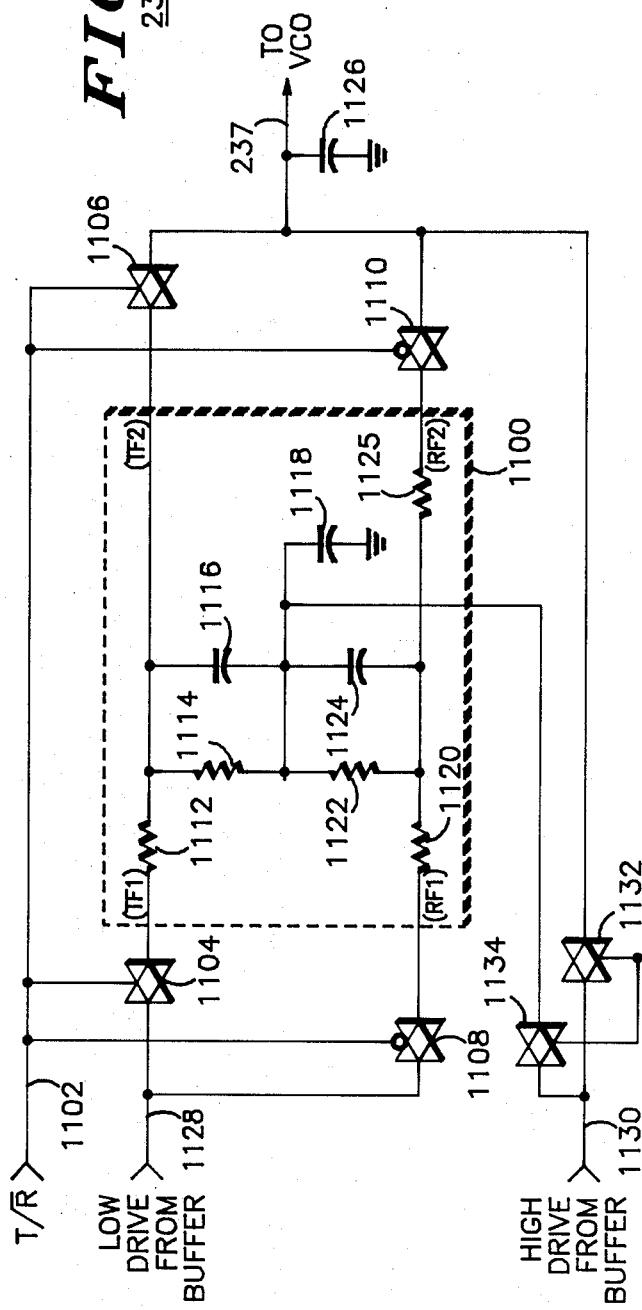
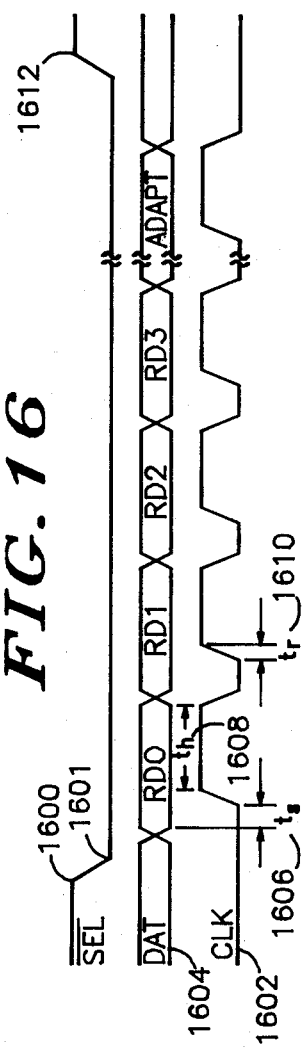

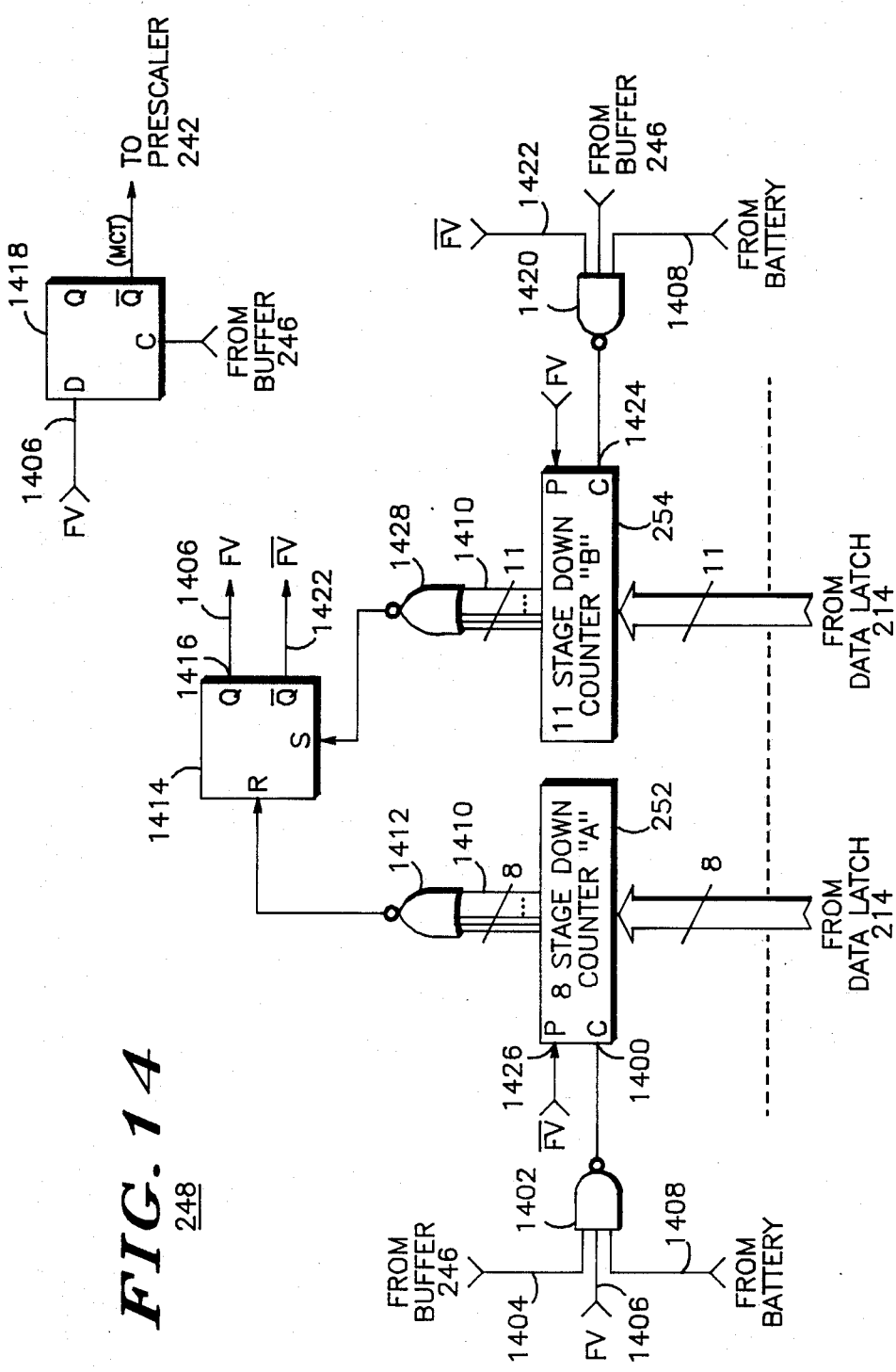

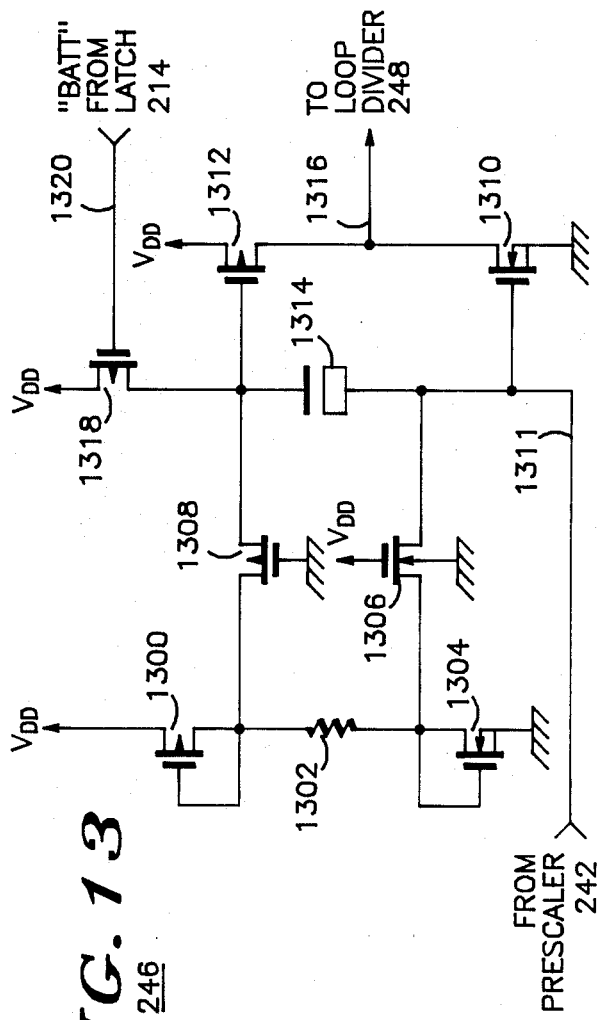

FREQUENCY SYNTHESIZER

TECHNICAL FIELD

This invention relates generally to frequency synthesizer circuits and more particularly to frequency synthesizer circuits that are suitable for implementation in Complementary Metal Oxide Semiconductor (CMOS) integrated circuits.

BACKGROUND ART

Those skilled in the art will appreciate the wide utilization of frequency synthesizers in modern day transceivers. An example of a conventional frequency synthesizer is illustrated in FIG. 1. The synthesizer 100 is comprised of a reference element 102, which may be any suitable crystal oscillator circuit or temperature compensated oscillator module. Ideally, since the frequency stability of the entire synthesizer 100 is determined by the stability of the reference frequency, the reference element 102 should provide an extremely frequency stable reference signal. A reference divider 104 receives the waveform provided by the reference element 102 and divides the signal by an appropriate amount to present a useable frequency to the phase detector 106.

Generally, a divided frequency range from 5 kHz to 30 kHz is suitable for most land mobile applications. The phase detector 106 compares the phase of the divided reference signal 105 (provided by the divider 104) and a signal provided by a loop divider 108. The phase detector 106 provides an output signal 110, which is dependent upon the phase difference between the signals supplied by the reference divider 104 and the loop divider 108. The phase comparison signal 110 is filtered by a loop filter 112 to filter noise and spurious energy to prevent unwanted modulation of the voltage controlled oscillator (VCO) 116. The filtered signal 114 is coupled to and controls the VCO 116 as is generally known in the art. The loop divider 108 "closes the loop" by dividing the output of the VCO 116 to provide a signal having a like frequency as the reference divider 104. In this way, the frequency of the VCO 116 is "locked" to the reference element as is known in the art.

Typically, each of the functional blocks of FIG. 1 are implemented using discrete elements, and small scale integration (SSI) devices. Each circuit of the frequency synthesizer consumes precious printed circuit (PC) board area, which defines the overall size of the frequency synthesizer. Those skilled in the art will appreciate that the current trend of modern-day transceivers is towards circuit miniaturization and improved circuit performance. However, improving the rudimentary frequency synthesizer of FIG. 1 generally tends to increase PC board area, thereby presenting a transceiver designer with conflicting performance/size design choices. For example, to provide a multi-frequency synthesizer it is known to make the reference divider 104 and the loop divider 108 programmable. Also, elaborate loop filters and phase detectors have been used to improve synthesizer "lock time". Each of these improvements require the use of more components leading to a larger frequency synthesizer. As is known in the art, additional parts consume more power, generate more heat, consume more PC board area and tend to reduce reliability.

Therefore, there is a need in the art for a high performance frequency synthesizer that consumes little PC board area while providing improved operational characteristics over the frequency synthesizers of the prior art.

SUMMARY OF THE INVENTION

Accordingly, it is an object of the present invention to provide an improved frequency synthesizer.

It is another object of the present invention to provide a high performance frequency synthesizer that avoids the detriments of the prior art.

It is a further object of the present invention to provide a high performance frequency synthesizer that consumes a small amount of printed circuit board area.

It is yet another object of the present invention to provide a high performance frequency synthesizer that consumes little power thereby generating less heat.

It is a further object of the present invention to provide a high performance frequency synthesizer having a fast "lock-time".

It is yet a further object of the present invention to provide a high performance frequency synthesizer having a low-noise and low-spurious response output signal.

It is yet a further object of the present invention to provide a high performance frequency synthesizer having a flat modulation response down to virtually DC.

It is yet another object of the present invention to provide a fully programmable frequency synthesizer.

It is yet a further object of the present invention to provide a serial programming protocol to provide improved synthesizer performance.

It is yet a further object of the present invention to provide a battery saver mode to conserve power.

It is yet another object of the present invention to provide a frequency synthesizer capable of being implemented on a large scale integrated (LSI) chip.

Accordingly, these and other objects are achieved in the present inventive frequency synthesizer.

Briefly, according to the invention, a programmable frequency synthesizer is provided having most components implemented on a single large scale integration (LSI) chip, which facilitates rapid frequency acquisition. Provision is made by the present invention to configure the frequency synthesizer for use in either a receiver or a transmitter. In the transmitter mode, modulation cancelling allows modulation down to approximate DC. A serial programming protocol is provided to program the frequency synthesizer.

BRIEF DESCRIPTION OF THE DRAWINGS

The features of the present invention which are believed to be novel are set forth with particularity in the appended claims. The invention, together with further objects and advantages thereof, may be understood by reference to the following description, taken in conjunction with the accompanying drawings, and the several figures of which like reference numerals identify like elements, and in which:

FIG. 3 is a schematic diagram of the input buffer of FIG. 2a;

FIG. 4 is a block diagram of the programmable divider of FIG. 2a;

FIG. 5 is a schematic diagram of the phase modulator of FIG. 2a;

FIG. 7a is a schematic diagram of the logic circuit of FIG. 2a;

FIG. 7b is a state diagram illustrating the operation of the circuit of FIG. 7a;

FIG. 8 is a schematic diagram of the RAMP circuit of FIG. 2a;

FIG. 9 is a schematic diagram of the sample and hold circuit of FIG. 2a;

FIG. 10 is a schematic diagram of the buffer of FIG. 2a;

FIG. 11 is a schematic diagram of the relative filter of FIG. 2a;

FIG. 12 is a schematic diagram of the voltage multiplexer of FIG. 2a;

FIG. 13 is a schematic diagram of the loop buffer of FIG. 2a;

FIG. 14 is a schematic diagram of the loop divider of FIG. 2a;

FIG. 15 is an illustration of the preferred data format for the shift register and data latch of FIG. 2a;

FIG. 16 is an illustration of the preferred programming sequence of the present invention;

DETAILED DESCRIPTION OF THE PREFERRED EMBODIMENT

Figure 1:
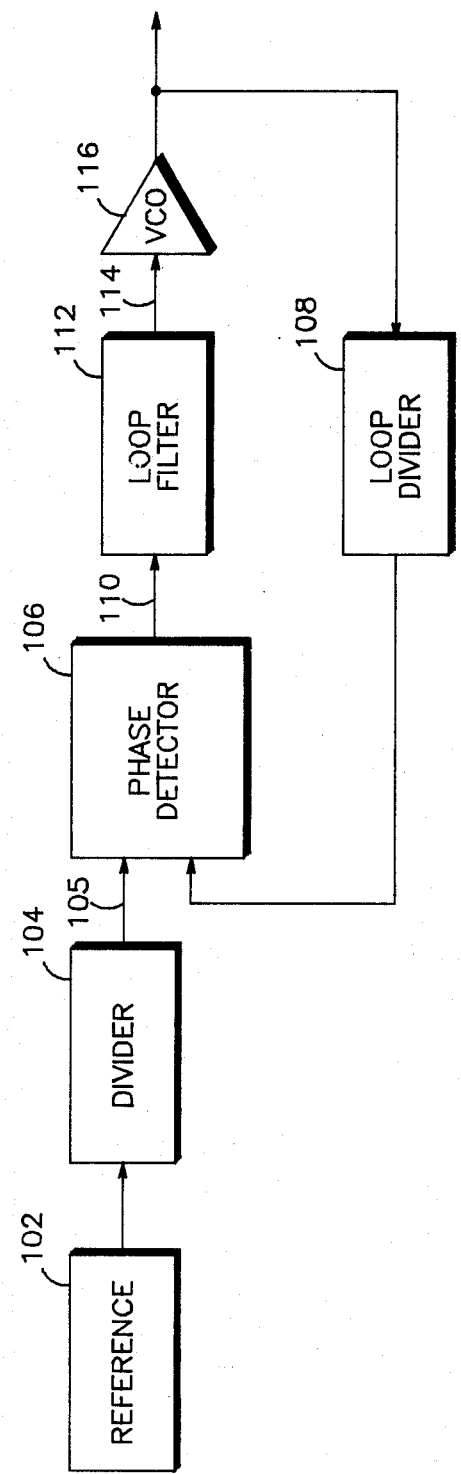
FIG. 1 is block diagram of a frequency synthesizer in accordance with the prior art.
Figure 2A:
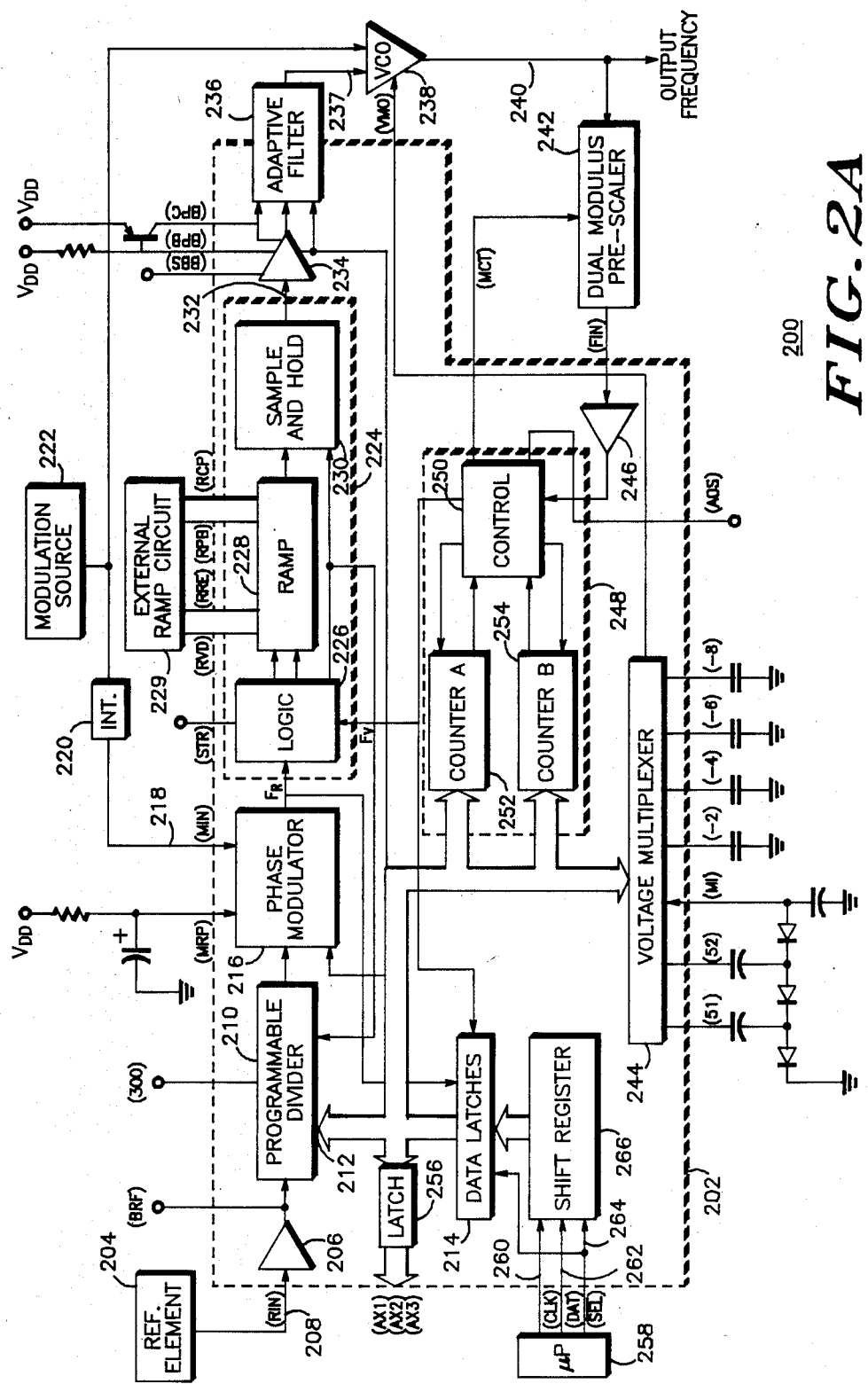
FIG. 2a is a block diagram of a programmable frequency synthesizer in accordance with the present invention.

Referring now to FIG. 2a, a block diagram illustrating the frequency synthesizer 200 of the present invention is shown. The portion 202 of the frequency synthesizer 200 may be conveniently implemented on a single large scale integrated (LSI) CMOS chip. The elements and components outside the portion 202 comprise elements that are required to fully exploit every aspect of the present invention. However, certain elements may be omitted depending upon any particular implementation of the present invention. For example, it may be advantageous for a portable transceiver to use the battery saver feature and the voltage multiplex 244. However, in a mobile application, in which battery power is not a significant consideration, these features may be omitted.

Figure 2B:
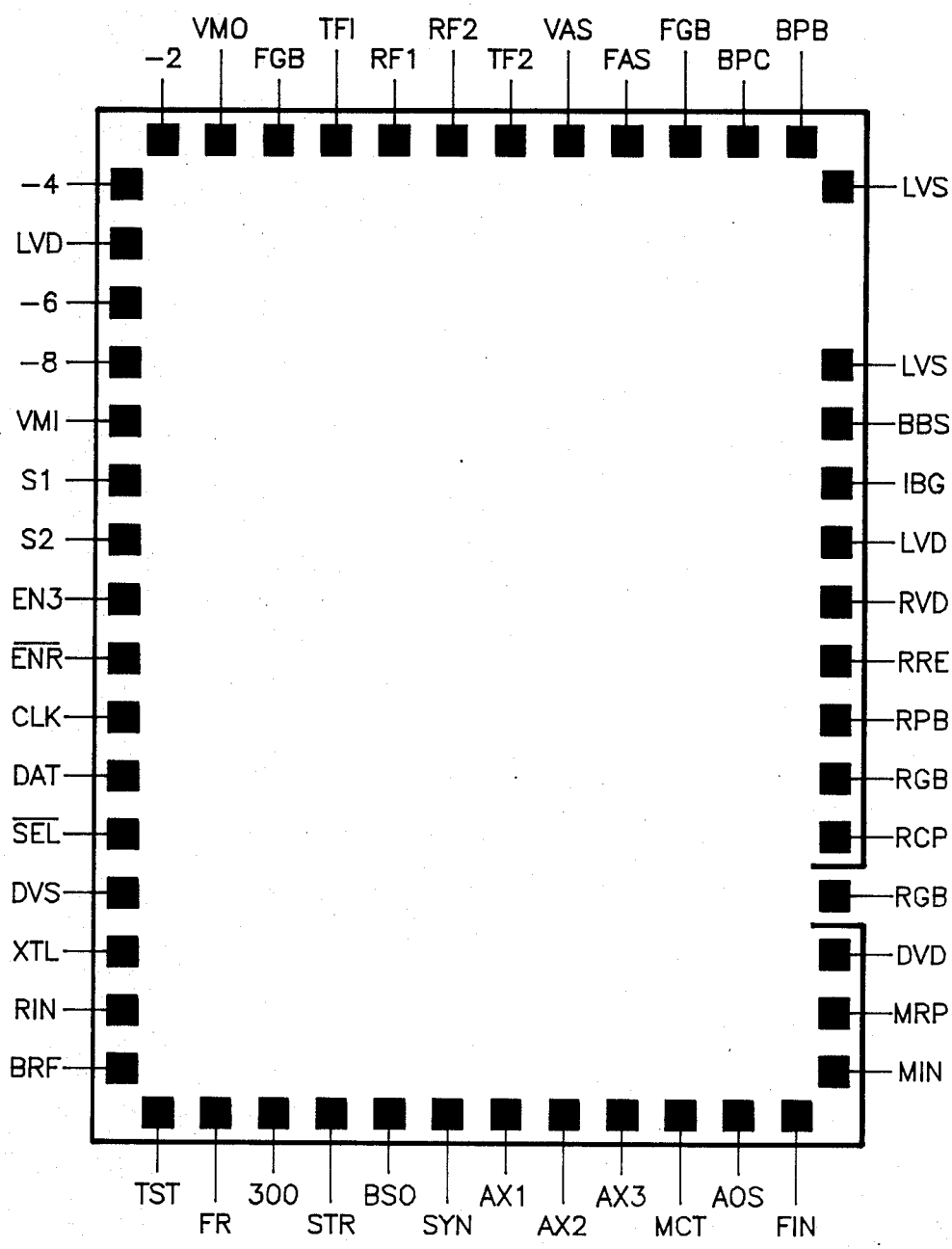
FIG. 2b is an illustration of the LSI die of the present invention.

Referring now to FIG. 2b, an illustration of the LSI chip die is shown. The die incorporates all the elements within the dotted portion 202 of FIG. 2a. The process used for fabricating the die is a polysilicon gate CMOS process and the overall die size is 197×196 mils. The die contains 54 "pads" to which wires may be bonded to a chip carrier as is known in the art. Each of the 54 pads of the die have a designated acronym which abbreviates its function. These are listed below in Table 1.

TABLE 1

| Pin Name | Description |
| --- | --- |
| LVD (2) | Linear VDD (5 v or 9.6 V) |
| DVD | Digital VDD (Same voltage as LVD) |
| LVS (2) | Two separate linear VSS pins (GND) |
| DVS | Digital VSS (GND) |
| 300 | 300 kHz output (Frequency at RIN divided by 7 or 8) |
| RIN | Reference input (2.1 MHz or 2.4 MHz) |
| XTL | A crystal oscillator can be formed by using this pin, RIN and the appropriate external circuitry |

TABLE 1-continued

| Pin Name | Description |
| --- | --- |
| BFR | Buffered Reference. A buffered version of the signal on RIN |
| FR | Output of the reference divider |
| EN3 | Enables 300 kHz output and S1, S2 outputs if at VDD. (Internal pullup will turn 300 kHz, S1, S2 on if the pin is floating.) |
| ENR | Enables FR output if at VSS (internal pullup will disable the output at FR if it is left floating) |
| SEL | Selects A79R to be programmed. SEL = 0, allows data to enter the shift register SEL = 1, blocks external data from the shift register SEL = 0->1, enables transfer of data from shift register to data latches |
| DAT | Serial data input pin |
| CLK | Clock signal for clocking serial data |
| TST | Test mode pin. (Should always be tied to VSS to avoid TEST mode.) |
| STR | Steer output. Indicates if synthesizer is locked. STR = 1 unlock case STR = 0 lock case |
| BSO | Battery Saver Output |
| SYN | Data Sync. A 10 us pulse synchronized to data latching in A79R |
| AX1-3 | Three auxiliary outputs programmable through the serial data scheme |
| AOS | Adapt or steer output. Logical "or" of the steer signal and adapt bit |
| FIN | Loop frequency input AC coupled, 1Vp-p, FIN [6.0 MHz (@ VDD = 5.0 V) |
| MCT | Modulus control output for prescaler MCT = 1 prescaler should count by P MCT = 0 prescaler should count by P + 1 |
| MIN | Modulation input of the phase modulator |
| MRP | Connection for the external ramp circuit of the phase modulator |
| RVD | Ramp VDD. This is the VDD connection for the ramp circuit |
| RRE | Ramp Resistor. The current setting resistor for the ramp is connected between RRE and the emitter of the ramp PNP |
| RPB | Ramp PNP Base. This is the connection for the base of the ramp PNP |
| RCP | Ramp Capacitor. This is the connection for the ramp capacitor and the collector of the ramp PNP. This is also the input to the on chip sample and hold |
| RGB (2) | Two Ramp Guardband Pins. The RGB pins are used to guardband the RCP pin on the circuit board. for the collector of the high drive output |
| BPC | Buffer PNP Collector. This is the connection for the collector of the high drive output buffer external PNP |
| BPB | Buffer PNP Base. The base connection for the high drive output buffer external PNP |
| BBS | Determines the bias point of the output buffer. If VDD = 5.0 V BBS should be tied to VDD. If VDD = 9.6 V BBS should be tied to VSS |
| TF1, TF2 RF1, RF2 VAS, FAS | Six connections for the external parts of the adaptive loop filter |
| FGB (2) | Two filter guardband pins. The FGB pins can be used to guardband the adaptive filter on the circuit board |
| S1, S2 | Clock driver outputs for the external negative voltage generator |
| VMI | Input to the negative voltage multiplexor. This voltage should not exceed −9.5 V (@VDD = 5.0). This ensures that the maximum voltage drop across the chip is <15 V |
| VMO | Output of the negative voltage multiplexor |
| −2, −4 | Four pins for external filter capacitors |
| −6, −8 | needed by the negative voltage multiplexor. |

Figure 3:
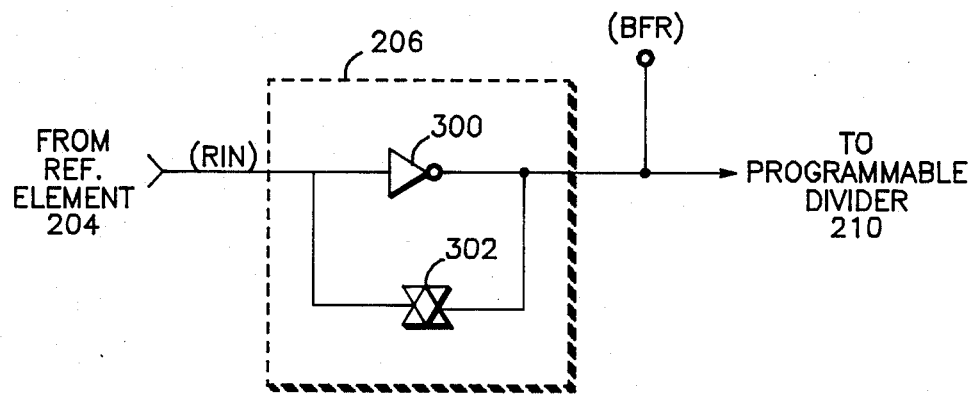

Referring again to FIG. 2a, the operation of the synthesizer 200 may be described. To facilitate a full understanding of the present invention, the operation of the synthesizer 200 will be described via FIG. 2a in conjunction with the several following drawings, which provide detailed illustrations of each of the major blocks. Initially, a reference element 204 provides a stable reference frequency to a buffer 206. Preferably, the reference element 204 is a temperature compensated crystal element, which provides a stable reference frequency of 2.1 MHz or 2.4 MHz. The reference signal is supplied to the synthesizer IC 202 at the RIN input port 208. The buffer 206 provides amplification and buffering between the reference element 204 and the programmable divider 210. The buffer 206 is illustrated in FIG. 3. The buffer 206 consists of an invertor 300, which is connected in parallel with a transmission gate 302. The purpose of the transmission gate 302 is to DC bias the invertor when the reference signal from the reference element 204 is AC coupled. As a convenience, an output to the IC 202 is provided "off chip" (BRF) so that the buffered reference signal may be used by other circuitry that employs the synthesizer 200 of the present invention.

Figure 4:
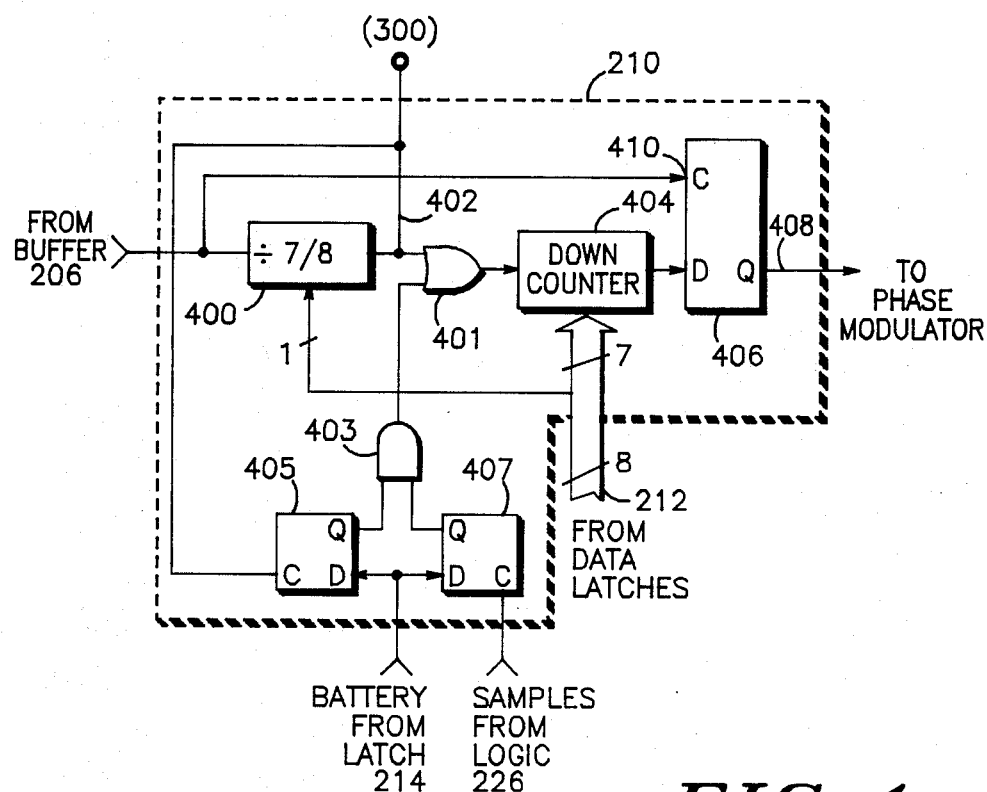

The buffered reference signal (BRF) is applied to the programmable divider 210, which divides the reference signal in response to its programming lines 212. FIG. 4 illustrates the programmable divider. The buffered reference signal from the buffer 206 is received by a first divider 400. The divider 400 is a ⅞ synchronous counter that divides the input signal by either 7 or 8. As previously mentioned, the preferred reference signal is 2.1 MHz or 2.4 MHz. By dividing these preferred signal frequencies by, respectively, 7 and 8, an intermediate signal 402 is formed and will have a frequency of 300 kHz. This signal is conveniently "pinned out" (300) to provide a signal that may be used to synchronize other circuits to the synthesizer 200. The intermediate signal 402 is received by an OR gate 401. As a second input, the OR gate 401 accepts a signal from an AND gate 403. When the AND gate output is asserted, the following circuitry is "frozen" in its current state since the output of the OR gate 401 will always be logical 1. The AND gate 403 will only provide a logical one output when both of the flip-flops 405 and 407 have their respective Q outputs asserted (i.e., logical 1). The flip-flop 405 is clocked by the intermediate signal 402 (i.e., 300 kHz) and the flip-flop 407 is clocked by the "sample" signal from the logic portion 226 of the phase detector 224. Both flip-flops receive the BATT bit from the data latch 214 at its D input. Thus, a "window" is formed during which an asserted BATT signal will stop the counter 404. Assuming the BATT bit is negated (i.e., logical 0), the intermediate signal 402 is passed to a second divider 404. The divider 404 is a 7 stage asynchronous binary down-counter whose output is low for 5 counts of its input frequency (300 kHz) and high for R-5 counts, where R is the programmed divisor. This output duty-cycle is chosen so as to maximize the useable phase range of the output signal 408, while contemporaneously allowing for a sufficient low cycle to discharge the main ramp capacitor in the ramp circuit 229. The divided signal is received by a reference synchronizer 406, which is preferably embodied as a D flip-flop that reduces the time between RIN going high (the C input 410) and the output signal 408 going high (D to Q). The speed limitation of the programmable divider 210 is determined by the propagation delay through the dividers 400 and 404. If this operational speed limitation is exceeded, the output signal 408 will appear to "jitter" as is known in the art. In the preferred embodiment of the present invention, the maximum RIN frequency is limited to 4 MHz (assuming VDD=5 volts).

The dividers 400 and 404 are programmed by 8 programming lines 212 from the date latches 214. The most significant bit (MSB) is routed to the divider 401 and is used to select whether the signal from the buffer 206 is divided by 7 or 8. In the preferred embodiment, a logic 1 level results in the input signal being divided by 8 and a logic 0 level results in division by 7. The remaining 7 programming lines are routed to the divider 404, which operates to divide the input signal via straight binary programming as is known in the art. The divider 404 may be programmed to divide between 6 and 127 (in steps of 1). Accordingly, the overall divide ratio of the divider 210 is between the values of 42 and 889 (in steps of 7) or 48 to 1016 (in steps of 8). As an example, and not as limitation, assume that the reference frequency RIN is 2.4 MHz and it is desired to have the output of the programmable divider 210 to be 5 kHz. Thus, the desired divide ratio would be:

$$2.4 \text{ MHz}/5 \text{ kHz} = 480 \tag{1}$$

Selecting the first divider to be 8, the remaining value to be divided must be:

$$480/8 = 60 \tag{2}$$

This value programmed in binary is:

$$60_{10} = 111100_2 \tag{3}$$

Therefore, the appropriate 7 bits of data to program the divider 210 would be:

$$0111100 \tag{4}$$

6 . . . 0 (bit position)

The divided signal from the programmable divider 210 is received by the phase modulator 216. As a second input, the phase modulator 216 receives a modulating signal 218 provided by integrating (220) any suitable modulation source 222. The combination of the integrator 220 and the phase modulator 216 provides frequency modulation of the divided reference signal provided by the programmable divider 210 (modulated by the modulation source 222). As will become more fully apparent hereinafter, the purpose of this arrangement is to provide modulation cancellation in the phase detector portion such that the output signal of the frequency synthesizer 200 may be modulated down to approximately zero Hertz. Those skilled in the art will appreciate that signalling information is often transmitted subaudio (i.e., below 300 Hz). Examples of signalling information commonly used by communication receivers includes, but is not limited to, private line (PL) signalling and its digital counterpart, Digital Private Line (DPL). Signalling such as PL and DPL enhance the operation of conventional communication devices especially in spectrally congested urban areas.

Figure 5:
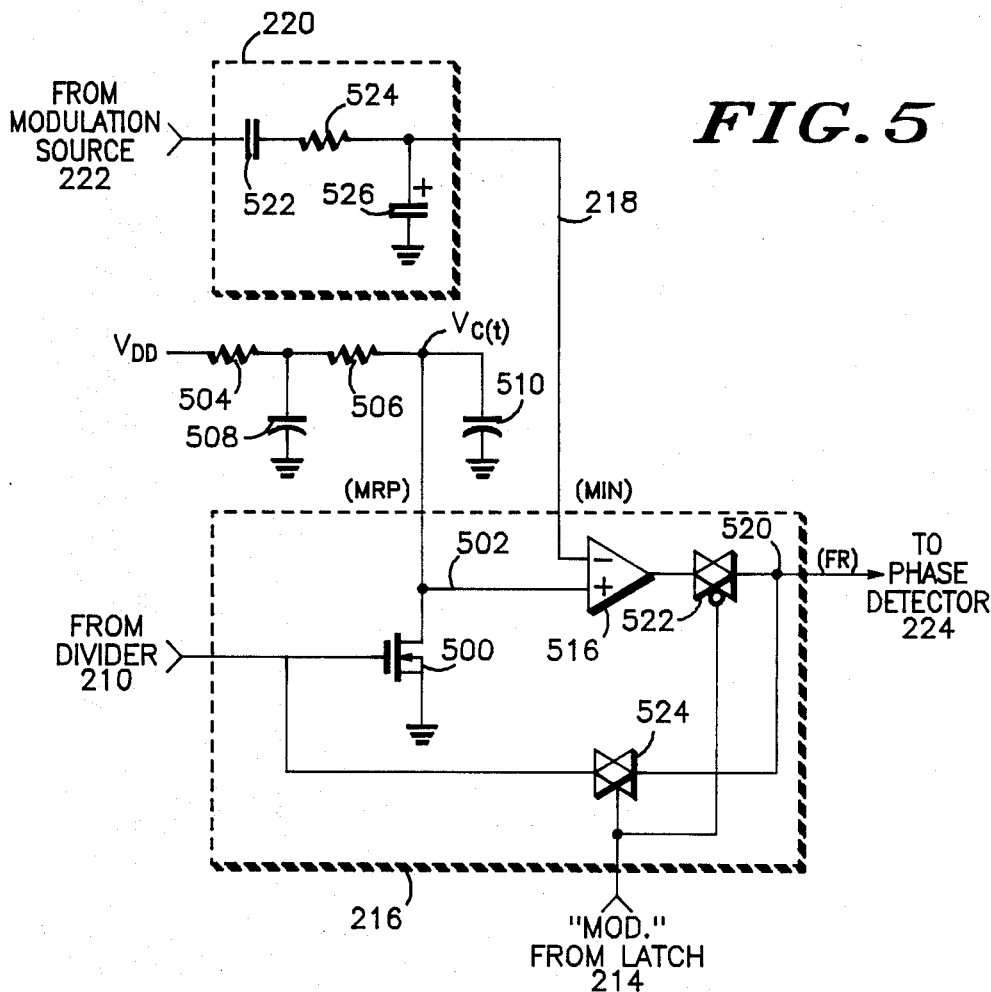

Referring now to FIG. 5, the phase modulator 216 and the integrator 220 are shown in schematic detail. Modulation from the modulation source is received by the integrator 220 by a coupling capacitor 522 and is integrated by a resistor 524 and a capacitor 526. The integrator 220 is located off-chip due chiefly to the large size of the capacitor 526, which is preferably in the 22 μf range. The modulation signal is provided (MIN) to an operational amplifier 516 of the phase modulator 216. The signal from the programmable divider 210 is received by a transistor 500, which operates to provide an inverted divided signal 502 to the OP amp 516. Coupled to the transistor 500 are "off-chip" resistors 504 and 506 and capacitors 508 and 510. The capacitor 508 and resistor 504 form a filter to prevent supply noise from modulating the ramp signal, which degrades the phase noise of the synthesizer output signal. The resistor 506 and the capacitor 510 form a ramp signal in accordance with their associated time constant. Thus, the capacitor 509 to begins to charge through the resistors 512 whenever the signal 502 is logical 1. When the signal 502 is logical 0, the voltage on the capacitor 510 will be discharged through the transistor 500 (see FIG. 6). The integrated modulation signal (MIN) is phase modulated onto the divided reference signal (see FIG. 6 and associated text) by the OP amp 516 and provided as an output signal 520, assuming that the transmission gate 522 is on. The transmission gate 522 is on whenever the MOD bit of the data latch 214 is programmed to logical 0. If the MOD bit is programmed to a logical 1, the phase modulator 216 is bypassed by the transmission gate 524 and the divided reference signal is provided as the output 520. In either case, the output signal 520 is commonly referred to as the FR signal in synthesizer parlance.

Figure 6:
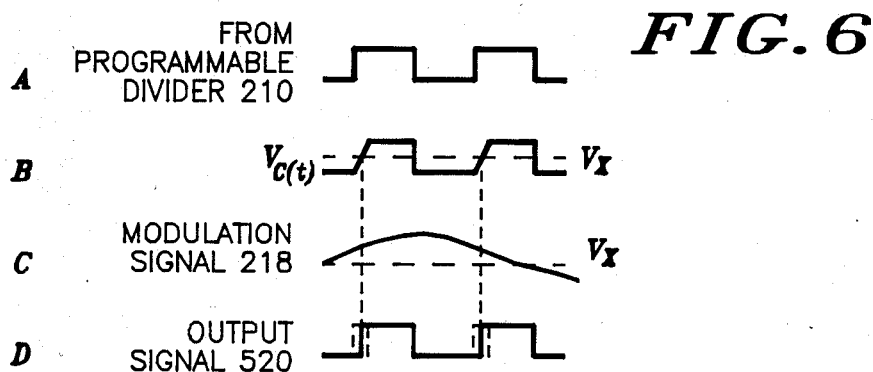
FIG. 6 is an illustration of the signals of FIG. 5.

Referring now to FIG. 6, there is shown a graphical illustration of the operation of the phase modulator 216. Waveform A is the divided reference signal provided by the programmable divider 210. Waveform B illustrates the voltage provided by the capacitor 510 of the phase modulator 216. Waveform C represents the modulation signal 218 provided by the integrator 220 and waveform D illustrates the output signal 520, which has been frequency modulated by the combined operation of the integrator 220 and the phase modulator 216.

The modulated signal provided by the phase modulator 216 is received by the phase detector 224. The phase detector 224 is of the sample and hold variety and consists of a logic section 226, a ramp generator 228 (and off-chip parts 22a), and a sample and hold circuit 230. Basically, the logic circuit 226 produces signals proportional to the time difference between the outputs of the phase modulator 216 (FR) and the loop divider 218 (FV). By charging an external capacitor during the time between the rising edges of these signals, a voltage ramp is generated in the ramp circuit 228/229 having a peak voltage proportional to the time difference between the two inputs. This peak voltage is then sampled by the sample and hold circuit 230, which provides the phase error signal 232 to the output buffer 234.

Figure 7B:
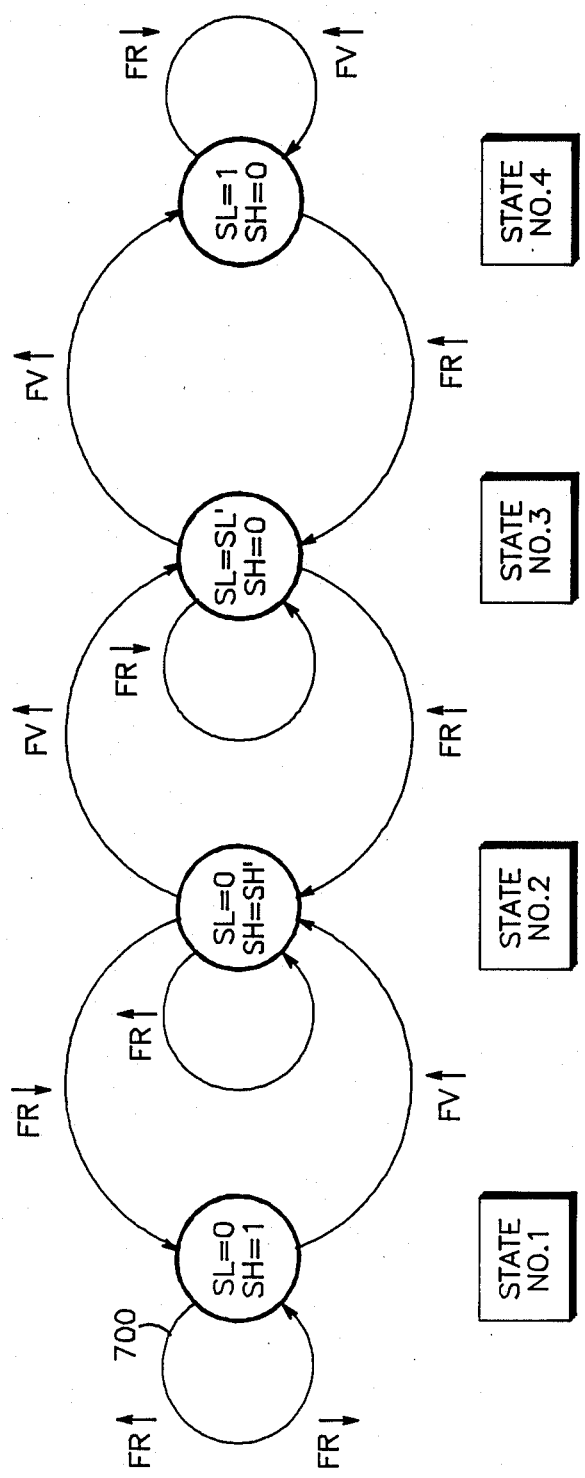

Referring now to FIGS. 7a and 7b, the operation of the logic section 226 of the phase detector 224 is shown. FIG. 7a is a schematic diagram of the logic section 226. The signal from the phase modulator 226 (FR) is received (700) by D flip-flops 702 and 704 (via the inverter 706). The signal from the loop filter 248 (FV) is received (708) by the D flip-flop 710. Each of the D flip-flops 702, 704, and 710 have their respective D inputs 712, 714 and 716 tied to VDD. Accordingly, each D flip-flop will "clock" a logic zero onto its $\overline{Q}$ output 724, 726 and 728 at each clock cycle. This logic level will be held until a signal is provided on their respective reset ports 718, 720, and 722, which will force a logic one level onto the $\overline{Q}$ output port. The $\overline{Q}$ outputs 724, 726 and 728 are coupled to combinational logic thereby forming an edge sensitive state machine which decides if FR and FV are at the same frequency, and if not, which frequency is higher. If the reference frequency is greater than the loop frequency (i.e., FR>FV), then the steering logic will assert the SH signal 734, which is provided by the logic portion 226 via the latch circuit 730. Conversely, the steer low (SL) signal is provided by the latch circuit 732 and is asserted whenever the reference frequency is less than the loop frequency (i.e., FR<FV).

The SH signal 734 and the SL signal 736 are used together with the FR and sample signal 756 to control the ramp circuit 228/229 and the sample and hold circuit 230. The SH signal 734 and the SL signal 736 may not both be logical one simultaneously; since FR cannot be both less than and greater than FV at one instance in time. The SH signal 734 is NOR'ed with the FR and sample signals in the NOR gate 740. The output (741) is OR'ed with the SL signal 736 to provide a logic 1 "Discharge" signal 746 to the ramp circuit 228/229 whenever SH=FR=SAMPLE=0, or SL=1. Of course, it would be inappropriate to discharge when the synthesizer is attempting to steer high or when the ramp voltage was being sampled. And, as previously mentioned, the discharging must take place during the 5 low-cycle counts of FR. However, when steering low, the ramp should be immediately discharged. When the synthesizer 200 is in the locked state, SL=SH=0 and the OR gate 748 will provide a lock indicator (STR) off-chip.

The SH signal 734, the FR signal and the sample signal are also used in conjunction with FV signal 708 to provide a "Stop" signal 751 to the ramp circuit 228/229. Since the D input of the flip-flop 750 is tied to VDD, a logic 1 will be clocked to the Q output on each rising edge of FV. The rising edge of SH, or the contemporaneous (744) logic 0 of FR and sample will reset (743) the "Stop" signal 751 regardless of the state of the FV signal. The FV signal 708 and the SH signal 734 are also used to supply the sample signal 576. Each is applied to an OR gate 754. However, the FV signal is first operated upon by a one-shot 752 which provides a uniform delay and pulse width as is known in the art. The OR gate 754 provides a "Sample" signal to the sample and hold circuit 230. The timing of the one-shot 752 is selected such that the "Stop" signal 751 will stop the ramp signal (750) generated by the ramp circuit 228/229 just prior to the "Sample"signal 756 commanding the sample and hold circuit 230 to sample the ramp waveform.

Referring now to FIG. 7b, a state diagram for the circuit of FIG. 7a is shown. Those skilled in the art will appreciate that state machines are best, and commonly, understood by reference to a state diagram. As an example, and not as a limitation, of the operation of the circuit of FIG. 7a, assume that the logic was in state 1 (i.e., SL=0 and SH=1) and that the next signal detected was either a rising edge of FR or a falling edge of FR. Accordingly, the logic would follow the loop 760 and stay in state 1. If the loop frequency rises, (FV), the logic moves to state 2 where SL=0 and SH is in the same state as in the previous logic state. If the loop frequency continues to rise, the logic moves to state 3 where SH=0 and SL=0 (since SL remains in the same state as state 2). Thus, by following the path indicated, depending upon whether the loop frequency or the reference frequency rises or falls, the next state of the logic portion can be determined. This in turn determines the logical values of SH and SL, which then determine whether the ramp is stopped or discharged or allowed to continue charging. Those skilled in the art will appreciate that operation via the state diagram of FIG. 7b allows only "smooth" frequency transitions as it moves from one state to the next. This arrangement ensures that no "false lock" modes occur in the steering logic 226.

Figure 8:
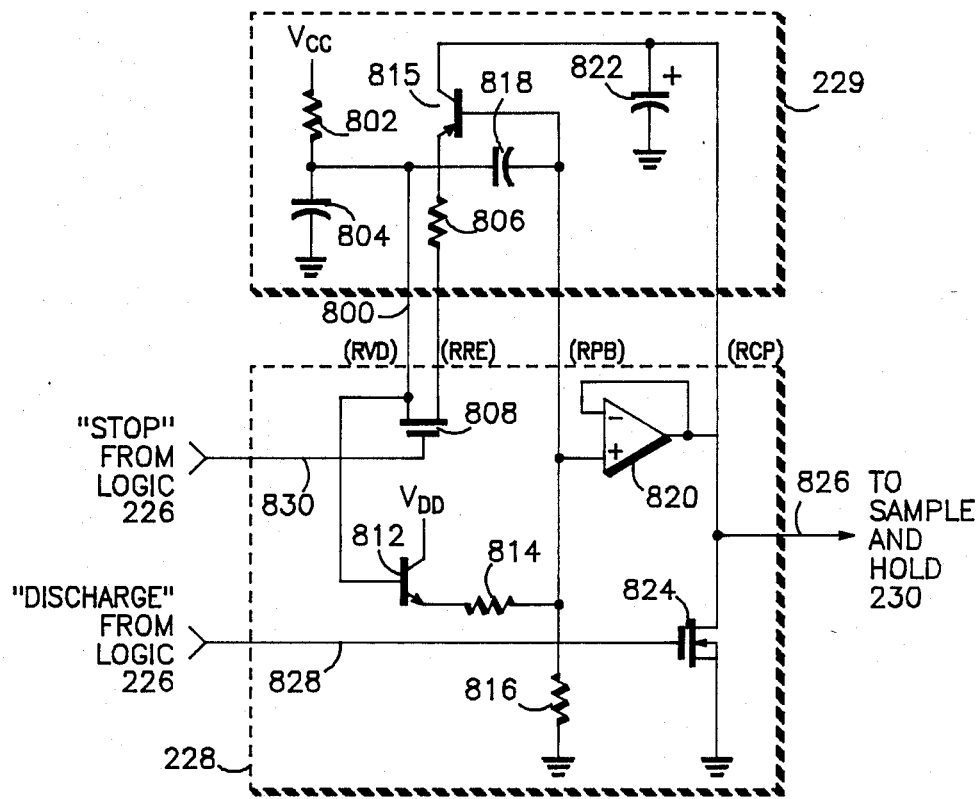

Referring now to FIG. 8, the ramp circuit 228 together with its external components 229 are shown in schematic form. The value the ramp waveform can achieve is determined by the voltage input (RVD) signal 800. This signal is provided by a resistor 802 and a capacitor 804, which filter any power supply noise from VCC. Preferably, the time constant formed by the resistor 802 and the capacitor 804 should be greater than 7 ms in order not to disturb the fast-lock operation of the loop. The voltage from RVD is coupled through the transistor 808 to the transistor 810 with about one-fifth of the voltage at RVD appearing across the resistor 806. A transistor 812 (having biasing resistors 814 and 816) compensates for the base-emitter drop of the external transistor 810. Optionally, a capacitor 818 may be used to bypass the base of the transistor 810 to remove as much circuit noise as possible. Preferably, if the capacitor 818 is employed, its value should be greater than 30 $\mu$f.

When the ramp capacitor 822 is charging, the transistor 810 will saturate, which causes the voltage across the capacitor 818 to decrease. When the ramp is stopped (830), it will take some time for the voltage across the capacitor 818 to charge up. This condition manifests itself as a change in phase detector gain and effects the lock time. An open-drain comparator 820 prevents the transistor 810 from saturating by sinking current when the collector-base voltage of the transistor 810 begins to forward bias. This allows a minimum noise circuit having a stable phase gain. When the "discharge" signal 828 from the logic section 226 asserts, the transistor 824 turns on and discharges the capacitor 822 by shorting it to ground. The voltage across the capacitor 822 is provided as an output signal 826, which is routed to the sample and hold circuit 230.

Figure 9:
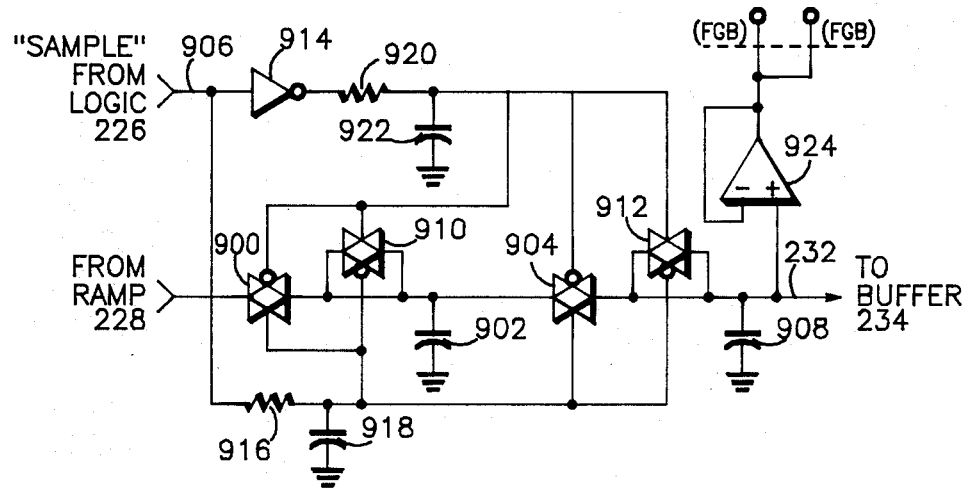

Referring now to FIG. 9, the sample and hold circuit 230 is illustrated. The ramp waveform is received from the ramp circuit 228 by a transmission gate 900. The transmission gate 900 operates to pass the voltage to the sampling capacitor 902 and a second transmission gate 904 when the sample signal 906 is logic one. The transmission gate 904 also passes the ramp voltage to a second charging capacitor 908. The purpose of this configuration is to reduce "feedthrough" when the sample and hold circuit 230 is in the off condition. Preferably, the capacitor 902 and the capacitor 908 are of equal value and preferably are 49.2 pf. Transmission gates 910 and 912 are "dummy" transmission gates. These transmission gates operate via an inverted sample signal (provided by the inverter 914) and provide equal but inverted feedthrough signals than those of the transmission gates 900 and 904, thereby cancelling the adverse feedthrough effect. Both the sample signal 906 and its inverted form provided by the inverter 914 are passed through filter networks 916, 918 and 920, 922, which reduce the "slew rate" of the sample and inverted sample signals. This operates to reduce the charge sharing effect between the capacitor 902 and the capacitor 908 during the transition between the sample signal and the inverted sample signal. The sample voltage provided by the capacitor 908 is provided as the output signal 232 to the buffer 234. Additionally, a unity gain OP amp 924 provides off-chip guard pins (FGB). These may be used to "surround" the printed circuit board foils for the capacitor 908 to prevent charge bleeding as is known in the art.

Referring now to FIG. 10, the adaptive output buffer 234 is shown. The signal 232 from the sample and hold 230 is received by a low noise OP amp 1000. The low noise OP amp 1000 drives the loop filter 236 when the loop is locked. A limiter 1001 prevents the output of the OP amp 1000 from being driven to $V_{SS}$ whenever the "LIM" bit of the data latch 204 is logical 1 (see FIG. 15). When the loop is adapting, the adapt signal 1004 is high and turns off the transmission gate 1002, while contemporaneously turning on the transmission gates 1004 and 1006. During the adapt cycle, the low noise amplifier 1000 drives the gate of the transistor 1010, which turns on the high drive buffer 1012. During the adapt mode, the collector of the high drive buffer 1012 is coupled to the biasing circuit (resistors 1014-1020) via the transmission gate 1006. The high drive buffer is designed to provide approximately 100 ma of current, which is determined by the biasing network 1022-1026. At the conclusion of the adapt mode, the adapt signal negates and the transmission gates 1004 and 1006 close simultaneously. When the input to the high drive buffer, drops below the voltage needed to sustain the output signal, (due to the closing of the transmission gate 1004) the high drive buffer 1012 turns off and a sinking loop circuit 1028 kicks in. As is known in the art, a sinking loop circuit is a group of devices that only sinks current when the external buffer is off, which prevents large currents from being pulled from the supply VCC. The base emitter resistor 1030 should be large enough to quickly turn off the transistor 1012 when the sinking circuit 1028 is activated, and preferably, has a value of 47 k ohms.

Referring now to FIG. 11, there is shown the adaptive filter 236 of the present invention. The adaptive filter 236 may be configured either a transmit filter and a receive filter depending upon the logical state of the T/R line 1102. When the T/R line is at a logical one level, the transmission gates 1104 and 1106 are on, while transmission gates 1108 and 1110 are off. In the transmit mode, the filter is comprised by the resistor 1112, the resistor 1114, and the capacitors 1116 and 1118. In the receive mode, the filter is comprised by the resistors 1120 and 1122 and the capacitors 1124 and 1118. In either configuration, the capacitor 1126 operates to provide a last stage of filtering prior to steering the VCO 238. When the synthesizer is lock, the low drive input (1128) from the buffer is routed through either the transmit or receive filter depending upon the state of the T/R line. When adapting, the high drive signal (1130) from the buffer is transmitted directly to the VCO by the transmission gate 1132, with the only filtering being provided by the capacitor 1126. Additionally, the transmission gate 1134 couples the high drive signal 1130 to the capacitor 1118 to keep the potential on both the capacitors 1118 and 1126 the same. This prevents capacitor 1118 from pulling charge off of the capacitor 1126 just after exiting the adapt mode. The steering signal 237 is used to adapt the VCO 238 frequency as is well known in the art. Thus, in the adapt mode, the transmit and receive filters are effectively shorted and the high drive signal is routed directly to the VCO 238 to more rapidly acquire the new frequency and return to a locked condition. The filter components (1100) are preferably located off chip due to their large component sizes. The preferred value for each of the components 1100 are listed below in Table 2.

TABLE 2

| Component | Value |
|---|---|
| R 1112 | 1 M ohm |
| R 1114 | 33 k ohm |
| C 1116 | 0.22 µf |
| C 1118 | 1 uf |
| R 1120 | 27 k ohm |
| R 1122 | 4.7 k ohm |
| C 1124 | 0.22 µf |
| R 1125 | 2.2 k ohm |

Figure 12:
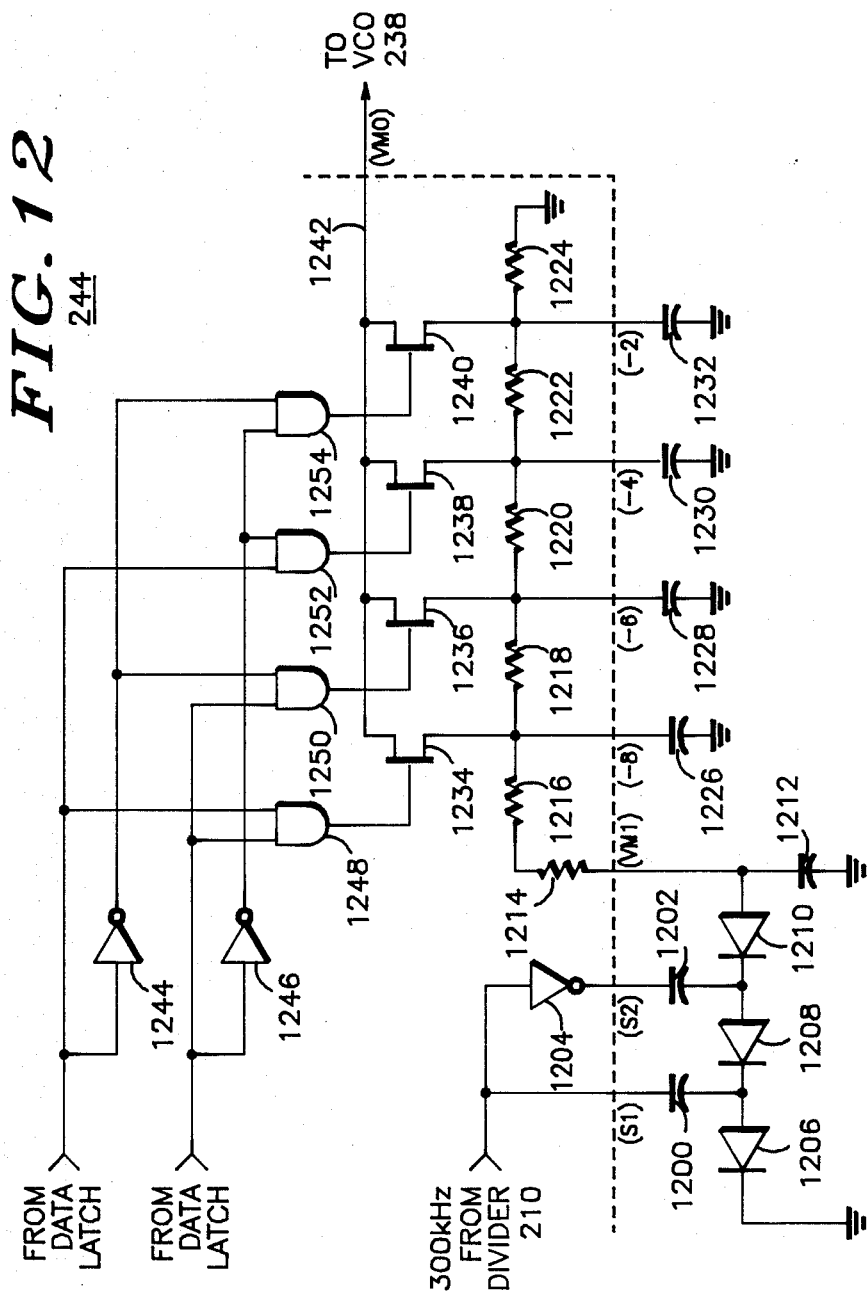

Referring now to FIG. 12, the voltage multiplexer 244 is shown. In a portable application, the battery voltage may not provide enough voltage swing to fully steer the VCO 238 across its entire tuning range. Accordingly, it is advantageous to bias one side of the tuning varactor to a negative voltage thereby increasing the overall tuning range. A negative voltage is generated by pulsing two capacitors 1200 and 1202 with the 300 kHz signal provided by the programmable divider 210 (see FIG. 4). The 300 kHz signal is applied directly to the capacitor 1200, while the capacitor 1202 receives an inverted 200 kHz stream via the inverter 1204. The S1 and S2 outputs swing from zero volts to 5 volts (assuming a portable application), while the junction between the diode 1206 and the 1208 will swing between −4.6 and 0.4 volts (assuming a 0.4 volt drop across the diode 1206). Accordingly, the junction between the diode 1208 and 1210 will swing between −4.2 volts and −9.2 volts. Thus, the capacitor 1212 will become charged to approximately −8.8 volts.

The voltage on the capacitor 1212 is received (VMI) by a resistive divider string (resistors 1215-1224). Alternately, if a negative voltage source is available, it may be coupled to the VMI input port. As is known in the art, various parts of the resistive ladder may be "tapped" as is shown in FIG. 12. Preferably, the resistor 1214 has a value of 8.7 k ohms and each of the resistors 1216-1224 have a value of 101.3 k ohms, which results in the voltage division providing −8, −6, −4, and −2 volts respectively. Preferably, each of these points are provided with a bypass capacitor 1225-1232, which filters out any remaining 300 kilohertz from the negative DC signals. Each of these voltage potentials are tied to a common (1242) line via the transmission gates 1234-1240. Those skilled in the art will appreciate that (with four voltages to choose from), 2 bits are required from the data latch 214 to select one of the four voltages to send to the VCO 238. Accordingly, a binary 2-4 decoder is formed by the invertors 1244 and 1246 and the NAND gates 1248-1254. The selection of the appropriate negative varactor bias by the voltage multiplexer 244 increases the steering swing of the VCO 238 in a portable application. If the synthesizer of the present invention were used in a mobile application having sufficient $V_{DD}$-$V_{SS}$ swing, the voltage multiplexer 244 may not be required.

The VCO 238 accepts as a third input a signal from the modulation source 222. Preferably, the VCO 238 is directly modulated by any means known in the art. As previously mentioned, the phase modulator 216 is also modulated by the modulation source (via the integrator 220) which provides modulation cancelling in the phase detector 224. This modulation cancelling enables the synthesizer of the present invention to be modulated down to virtually DC so that signalling information (such as PL and DPL) may be directly modulated to the output signal 240. The output signal 240 of the VCO 238 is returned to the synthesizer by the prescaler 242. Preferably, the prescaler 242 is of the dual modulus (M, M+1) type. The VCO output signal 240, divided by the prescaler 242, is received on chip by the loop buffer 246. The loop buffer 246 is illustrated in schematic form in FIG. 13. A bias network is formed by the transistors 1300 and 1304 together with the resistor 1302. The bias network sets a voltage on the gate source transistors 1306 and 1308, which is approximately around 1 voltage threshold of the output transistors 1310 or 1312 (the gates of which are coupled by the capacitor 1314). If the input signal 1311 is at least one voltage threshold, the gate source voltage provided by transistors 1306 and 1308 will alternately swing from 3/2 voltage thresholds (on) to ½ voltage threshold (off). This provides a full voltage swing on the output 1316 to the loop divider 248. The output transistors 1310 and 1312 operate so long as the BATT signal (1320) is not asserted. When the BATT signal is asserted (logic 1), the output devices 1310 and 1312 are shut down to conserve power.

Referring now to FIG. 14, there is shown the loop divider 248. The loop divider 248 consists of an A counter 252, a B counter 254, and associated combinational logic that makes up a control section 250. When used with the external dual modulus (M, M+1) prescaler 242, the loop divider will divide the VCO frequency by a value (N) which is:

$$N=B(M)+A(M+1)=M(A+B)+A$$

This results from the loop divider 248 using only the B counter while the prescaler is counting by M. When the prescaler is counting by M+1, the loop divider is using only the A counter and the B counter is being loaded with data from the data latch 214. This arrangement allows for one full clock cycle to load data into either the A or B counter and thus needs no look ahead logic thereby improving the maximum divider frequency.

To increment N by 1, the A counter is incremented by 1 and the B counter is decremented by 1. Preferably, the A counter 252 consists of a 8 stage ripple down counter, which can be incrementally programmed between the value of 1 and 255. The B counter is preferably an 11 stage ripple down counter, which can be incrementally programmed between 1 and 2047.

Referring still to FIG. 14, assume that the A counter 252 has been loaded with data and is currently counting down. The A counter has a clock port 1400, which receives a clock signal from the NAND gate 1402. The clock signal is provided by the buffer signal 1404 from the buffer 246. The divided signal FV 1406 ensures that the A counter 252 only counts during half of the loop frequency time. Additionally, the BATT 1408 is coupled to the NAND gate 1402, which may turn off the loop divider 248 thereby conserving power. When the 8 stage counter has counted down to zero, the 8 output lines 1410 will cause the NOR gate 1412 to assert its output. The NOR gate 1412 is coupled to the reset port of a set-reset flip-flop 1414, which causes its Q port (FV) 1416 to go to the logical zero state. When FV goes to logical zero state, the NAND gate 1402 is prevented from operating and the flip-flop 1418 clocks a logical one state to its Q̄ output. This signal is coupled to the prescaler 242 (MCT), which changes the prescaler modulus to the M+1 divider. During this phase of FV, the B counter begins counting via the NAND gate 1420. The $\overline{FV}$ signal 1422 (provided by the flip-flop 1414) enables the NAND gate 1420 to pass the signal from the buffer 246 to the clock port 1424 of the B counter 254.

Contemporaneously, the parallel load port 1426 of the A counter 252 parallel loads the counter with data provided from the data latch 214. In a similar manner, the B counter will now count down to zero and assert a signal from its NOR gate 1428 when the counter reaches zero. This is coupled to the set port of the flip-flop 1414, which forces the FV signal 1406 to a logical 1 state. This causes the prescaler to change moduli (M) and the A counter to begin counting down. This process continues indefinitely provided that the battery signal 1408 is asserted (see FIG. 15).

Referring now to FIG. 15, the preferred format of the data latch 214 is illustrated. Preferably, the data latch 214 comprise a 38 bit latch organized as shown in FIG. 15. The first portion (1500) comprises 7 bits of data, which programs the programmable divider 210 to a selected divide ratio. Bit 8 (1502) selects whether the initial divider of the programmable divider 210 divides by 7 or 8. Preferably, if bit 1502 is a logical zero division will be by 7 and if the bit is logical 1 it will divide by 8. The 9th bit (1504) determines whether or not the synthesizer 200 operates in the portable or mobile mode. Preferably, if bit 9 is a logical 1 portable functions are selected while if bit 9 is logical zero mobile functions are selected. Bit 10 (1506) enables the limiting function of the output buffer 234. Preferably, logical 1 turns the limiter on and logical zero turns the limiter off. Bit 11 (1508) determines whether or not the phase modulator 216 is on or off. If bit 11 is a logical 1, the phase modulator is on; if bit 11 is a logical zero the phase modulator is off. Such selections are typically made depending upon whether or not the synthesizer is in the receive or transmit mode. Those skilled in the art will appreciate that in the receive mode the synthesizer is not modulated and therefore does not require modulation cancellation. Bits 12-22 (1510) comprise 11 bits of data, which are programmed into the B counter 254 of the loop divider 248. Bits 23-30 (1512) comprise the 8 data bits programmed to the A counter 252 of the loop divider 248. Bit 31 (1514) determines whether the adaptive filter 236 operates in the transmit or receive mode. Preferably, if bit 1514 is a logical 1 the transmitter filter is selected and if the bit is a logical zero the receive filter is selected. Bits 32 and 33 (1516) comprise the voltage multiplex select bits which determine which of the four negative voltages are applied to the VCO 238. Preferably, the selection is made according to the following:

| Bit 32 | Bit 33 | Voltage Selected |
|--------|--------|------------------|
| 0 | 0 | −2 |
| 0 | 1 | −4 |
| 1 | 0 | −6 |
| 1 | 1 | −8 |

Bits 34-36 (1518) comprise three auxiliary signals that can be used for general purpose functions. These signals are provided from the data latch 214 to an output latch 256 that provide a specified drive level to off chip areas. Such ports can be useful in programming other circuits or devices to operate in synchronizm with the synthesizer 200 and may be used or not used depending upon the particular implementation. Bit 37 (1520) is the battery saver (BATT) bit. When bit 37 is set to the logical 1 state, the loop divider 248 and the reference divider 212 are frozen at their current state. This saves the power consumed by the counters as they operate in their normal states. When the battery saver bit (1520) is programmed to a logical zero, the dividers will begin counting from their last state. Bit 38, (1522) is the adapt bit that signals the start and end of the adapt sequence, during which time the synthesizer 200 changes its operating frequency.

The synthesizer 200 is serially programmed by a microprocessor 258 or equivalent. To program the synthesizer 200, three signals are required; a clock signal 260, a data signal 262 and a select signal 264. Referring now to FIG. 16, the preferred programming sequence is shown. When $\overline{SEL}$ is high, any transitions on the CLK and DAT pins are ignored. With $\overline{SEL}$ high, the data in the shift register 266 may be latched into the data latch 214. When $\overline{SEL}$ goes low (1600) the synthesizer 200 is selected for programming and the data in the shift register 266 is not allowed to pass to the data latch 214. After the $\overline{SEL}$ line has achieved a logical 0 state (1601) data is serially clocked (1602) into the shift register 216 beginning with bit 1 (RDO) and ending with bit 38 (the adapt bit). The clock signal 1602 is skewed slightly from the data signal 1604 by an amount $T_s$ (1606), which is the data setup time. During this time, the data must become stabilized and is held for a time $T_h$ (1608) so that it may be latched into the shift register 266. In the preferred embodiment of the present invention, the data set-up and hold time limit the programming speed to approximately 1 MHz. The clock signal 216 goes from logical 1 to logical zero and vice versa in a finite amount of time (1610) commonly referred to as the rise time. In the preferred embodiment of the present invention, the rise time is less than 10 μs. When programming is complete, the SEL line returns to logic 1 level (1612) so that the data may be latched into the data latch 214. Preferably, the latching of the data from the shift register 266 to the data latch 214, and thus to the various portions of the synthesizer 202 are done under various conditions. The first of these conditions is $\overline{SEL}$ latching. Selected data bits may be latched into the data latches 214 on the rising edge of the $\overline{SEL}$ signal. This assures that such bits such as bits 1500, 1502 and 1520 are latched during out-of-lock conditions. On the first rising edge of the FR signal (following the rising of the $\overline{SEL}$ signal), bits 1502, 1504, 1506, 1508 and 1522 are latched. On the first rising edge of the FV signal (following the raising of the $\overline{SEL}$ signal), bits 1510, 1512, 1516, and 1518 are latched. This sequence is used to rapidly reprogram the loop divider 248, which helps achieve fast lock.

The procedure for changing frequencies is controlled through the adapt bit (bit 38, see FIG. 15). When a new frequency is desired, new divider data and the adapt bit are programmed into the synthesizer. After approximately 3 ms, the loop should be locked at the new frequency. At the end of the adapt sequence the adapt bit is programmed back to logical zero.

Figure 17:
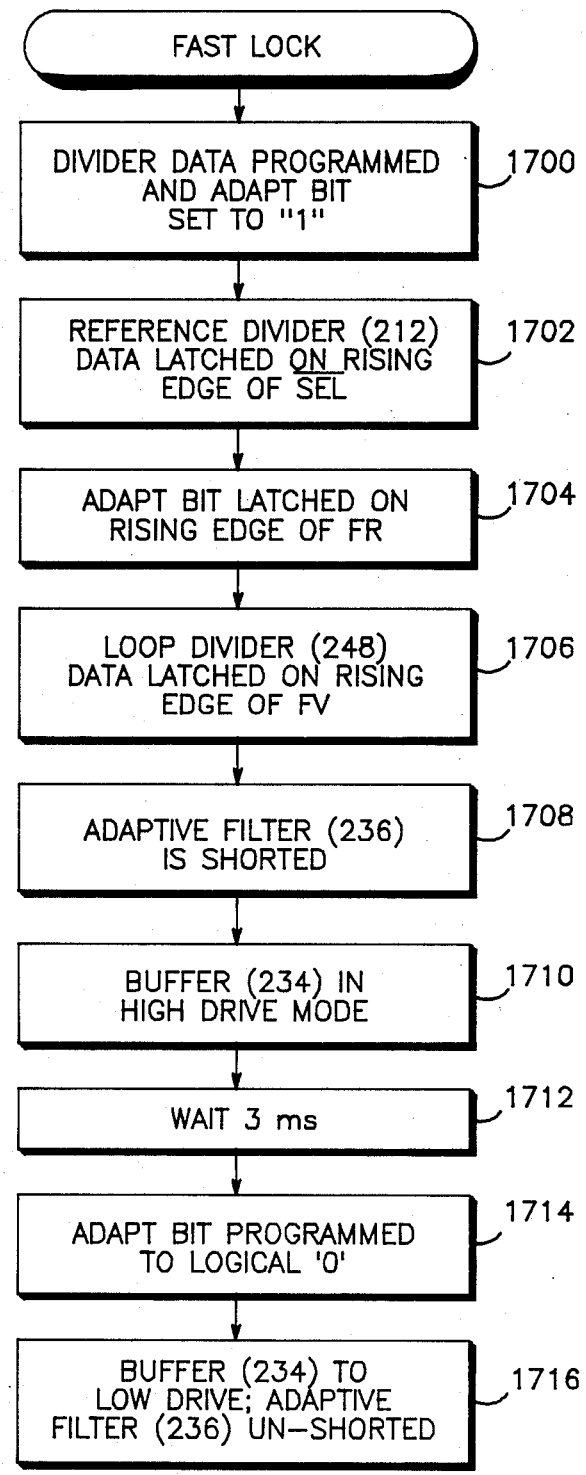
FIG. 17 is a flow diagram illustrating the sequence of events to adapt the present invention to a different frequency.

Referring now to FIG. 17, the fast lock sequence of the present invention is shown. The routine begins in step 1700 where the divider data and the adapt bit are programmed into the shift register 266 (see FIG. 16). In step 1702, the reference divider 212 data is latched on the rising edge of SEL (see FIGS. 4, 15 and 16). In step 1704, the adapt bit is latched on the rising edge of FR (see FIGS. 15 and 16). In step 1706, the loop divider 248 data is latched on the rising edge of FV (see FIGS.

14–16). In step 1708, the asserted adapt bit shorts the adaptive filter 236 (see FIG. 11). In step 1710, the buffer 234 is adapted to operate in the high drive mode (see FIG. 10). In step 1712, the microprocessor 258 waits a predetermined amount of time (preferably 3 milliseconds) and reprograms the adapt bit to logical zero in step 1714. In step 1716, the buffer 234 is returned to the low drive mode and the short across the adaptive filter 236 is removed allowing normal (locked) operation. The timed latching sequence provided by using selective rising edges allows for rapid relocking of the synthesizer 200 without causing excessive transients or noise. In practice, it has been determined that the present synthesizer 200 can relock to a different frequency in less than 3 ms.

In summary, an improved frequency synthesizer has been described and shown which has a fast lock time superior to any known single loop, low FR (5 kHz) synthesizer in the prior art. Additionally, the synthesizer of the present invention can be modulated down to approximately 0 Hz to allow the easy incorporation of signalling. A significant portion (202) of the frequency synthesizer 200 may be conveniently implemented on a single LSI CMOS chip (see FIG. 2b) for reduced size and power consumption, while contemporaneously improving reliability.

While a particular embodiment of the present invention has been described and shown, it should be understood that the present invention is not limited thereto since many modifications may be made. It is therefore contemplated to cover by the present application any and all such modifications which fall within the true spirit and scope of the basic underlying principles disclosed and claimed herein.

What is claimed is:

1. A programmable frequency synthesizer, comprising:
   means for providing a reference signal;
   means for adaptively dividing said reference signal to provide a divided signal;
   voltage controlled oscillator means for providing an output signal in response to a control signal;
   means for simultaneously frequency modulating said output signal and said divided signal with an information signal to provide, respectively, a modulated output signal and a modulated divided signal, whereby the frequency synthesizer may be modulated down to approximately zero hertz;
   prescaler means for dividing said modulated output signal to provide a scaled output signal;
   means for comparing said modulated divided signal and said scaled output signal to provide a phase error signal;
   means for adaptively filtering said phase error signal to provide said control signal;
   means for controlling at least said adaptive divider means and said adaptive filtering means;
   means for serially programming said control means, whereby, the frequency synthesizer may be rapidly reprogrammed.

2. The programmable frequency synthesizer of claim 1, wherein said adaptive dividing means comprises:
   a first divider operable to divide said reference signal by either 7 or 8 to provide an intermediate signal;
   a second divider, coupled to the first divider, for dividing said intermediate signal by a predetermined value to provide said divided signal.

3. The programmable frequency synthesizer of claim 1, wherein said comparing means comprises a sample and hold phase comparator.

4. The programmable frequency synthesizer of claim 1, wherein said adaptive filter means operates in a first mode to filter said error signal, and operates in a second mode to bypass said filter.

5. The programmable frequency synthesizer of claim 4, wherein said adaptive filter comprises a transmit filter.

6. The programmable frequency synthesizer of claim 4, wherein said adaptive filter comprises a receive filter.

7. The programmable frequency synthesizer of claim 1, which further includes means for generating a negative voltage.

8. The programmable frequency synthesizer of claim 7, which includes means for dividing said negative voltage to provide a plurality of negative voltages, and means for coupling a selected one of said plurality of negative voltage to said voltage controlled oscillator.

9. A programmable frequency synthesizer, comprising:
   means for providing a reference signal;
   means for predeterminedly dividing said reference signal to provide a first divided signal;
   means for adaptively dividing said first divided signal to provide a second divided signal;
   voltage controlled oscillator means for providing an output signal in response to a control signal;
   means for simultaneously frequency modulating said output signal and said second divided signal with an information signal to provide, respectively, a modulated output signal and a modulated divided signal, whereby the frequency synthesizer may be modulated down to approximately zero hertz;
   prescaler means for dividing said modulated output signal to provide a scaled output signal;
   means for comparing said modulated divided signal and said scaled output signal to provide a phase error signal;
   means for adaptively filtering said phase error signal to provide said control signal, whereby said adaptive filtering means operates in a first mode to filter said phase error signal and is temporarily shorted in a second mode to facilitate rapid synthesizer reprogramming;
   means for controlling at least said adaptive divider means and said adaptive filtering means; means for serially programming said control means,
   whereby, the frequency synthesizer may be rapidly reprogrammed.

10. The programmable frequency synthesizer of claim 9, wherein said comparing means comprises a sample and hold phase comparator.

11. The programmable frequency synthesizer of claim 9, wherein said adaptive filter comprises a transmit filter.

12. The programmable frequency synthesizer of claim 9, wherein said adaptive filter comprises a receive filter.

13. The programmable frequency synthesizer of claim 9, which further includes means for generating a negative voltage.

14. The programmable frequency synthesizer of claim 13, which includes means for dividing said negative voltage to provide a plurality of negative voltages, and means for coupling a selected one of said plurality of negative voltage to said voltage controlled oscillator.

15. A serial programming protocol, for programming a programmable frequency synthesizer, comprising the steps of:
 (a) asserting a select signal;
 (b) synchronously transmitting 38 data bits consisting of:
  (i) 8 bits of reference divider data;
  (ii) a portable/mobile select bit;
  (iii) a buffer limiter select bit;
  (iv) a phase modulator activation bit;
  (v) 19 bits of loop divider data;
  (vi) a transmit/receive select bit;
  (vii) 2 bits of multiplexer data;
  (viii) 3 auxiliary output data bits;
  (ix) a battery saver mode enable bit;
  (x) a fast-lock adapt mode enable bit;
 (c) removing said select signal of step (a).

16. In a frequency synthesizer having a reference element and a first divider for providing a reference signal (FR) and second divider for dividing an output signal to provide a loop signal (FV), the FR and FV signals being compared in a phase comparator to provide an error signal to an adaptable buffer and filter, and said frequency synthesizer being programmable during a time period determined by an asserted select signal, a method for rapidly acquiring another frequency comprising the steps of:
 (a) asserting the select signal;
 (b) providing at least data for programming a first and second divider and an adapt command signal;
 (c) programming said first divider upon the removal of the select signal of step (a);
 (d) asserting said adapt command signal upon the occurrence of the first rising edge of the FR signal;
 (e) programming said second divider upon the occurrence of the first rising edge of the FV signal;
 (f) adapting the buffer in response to step (d);
 (g) shorting the filter in response to step (d);
 (h) removing the adapt command signal after a predetermined time interval;
 (i) returning the adaptive buffer to its original state;
 (j) returning the adaptive filter to its original state.

* * * * *